US012628461B2

(12) United States Patent
Frey

(10) Patent No.: US 12,628,461 B2
(45) Date of Patent: May 12, 2026

(54) PASSIVATION METHOD FOR A PASSAGE OPENING OF A WAFER

(71) Applicant: AZUR SPACE Solar Power GmbH, Heilbronn (DE)

(72) Inventor: Alexander Frey, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 629 days.

(21) Appl. No.: 17/007,616

(22) Filed: Aug. 31, 2020

(65) Prior Publication Data

US 2021/0066515 A1    Mar. 4, 2021

(30) Foreign Application Priority Data

Aug. 29, 2019    (DE) ..................... 10 2019 006 097.0

(51) Int. Cl.
 *H10F 77/30* (2025.01)
 *H10F 10/142* (2025.01)
  (Continued)
(52) U.S. Cl.
 CPC .......... *H10F 77/311* (2025.01); *H10F 10/142* (2025.01); *H10F 10/16* (2025.01); *H10F 10/19* (2025.01); *H10F 77/223* (2025.01)
(58) Field of Classification Search
 CPC ........... H01L 31/02167; H01L 31/0336; H01L 31/0687; H01L 31/078; H10F 77/311;
  (Continued)

(56) References Cited

U.S. PATENT DOCUMENTS

| | | | |
|---|---|---|---|
| 5,425,816 A | 6/1995 | Cavicchi et al. | |
| 8,993,873 B2 | 3/2015 | Youtsey et al. | |

(Continued)

FOREIGN PATENT DOCUMENTS

| | | |
|---|---|---|
| CN | 102437242 A | 5/2012 |
| EP | 0528311 A2 | 2/1993 |

(Continued)

OTHER PUBLICATIONS

De Lafontaine, Mathieu, et al. "III-V/Ge multijunction solar cell with through cell vias contacts fabrication." Poster in 14th International Conference on Concentrator Photovoltaic Systems (CPV-14). 2018. (Year: 2018).*

(Continued)

*Primary Examiner* — Joshua Benitez Rosario
*Assistant Examiner* — Scott E Bauman
(74) *Attorney, Agent, or Firm* — Muncy, Geissler, Olds & Lowe, P.C.

(57) ABSTRACT

A passivation method for a passage opening of a wafer, at least having the steps of: providing a wafer having a top, a bottom and comprising a plurality of solar cell stacks, wherein each solar cell stack has a Ge substrate that forms the bottom of the wafer, a Ge sub-cell, at least two III-V sub-cells, in the named order, and at least one passage opening extending from the top to the bottom of the wafer, with a contiguous side wall and a circumference that is oval in cross section, and applying a dielectric insulating layer by means of chemical vapor deposition to the top of the wafer, the bottom of the wafer and the side wall of the passage opening.

11 Claims, 1 Drawing Sheet

(51) Int. Cl.
  *H10F 10/16* (2025.01)
  *H10F 10/19* (2025.01)
  *H10F 77/20* (2025.01)
(58) Field of Classification Search
  CPC ...... H10F 77/223; H10F 10/142; H10F 10/16; H10F 10/19
  See application file for complete search history.

(56) References Cited

U.S. PATENT DOCUMENTS

| | | | |
|---|---|---|---|
| 9,246,046 B1 * | 1/2016 | Harrington | ........... H01L 31/202 |
| 9,680,035 B1 | 6/2017 | Chary et al. | |
| 2002/0022327 A1 * | 2/2002 | Park | .................... H01L 21/3081 |
| | | | 257/E29.267 |
| 2006/0231130 A1 | 10/2006 | Sharps et al. | |
| 2007/0107773 A1 | 5/2007 | Fork et al. | |
| 2008/0185038 A1 * | 8/2008 | Sharps | ............ H01L 31/022425 |
| | | | 438/94 |
| 2012/0288980 A1 * | 11/2012 | Moon | .................. H10F 77/219 |
| | | | 257/E31.127 |
| 2013/0008501 A1 * | 1/2013 | Guillevin | .......... H01L 31/02245 |
| | | | 257/E31.127 |
| 2013/0263920 A1 * | 10/2013 | Fidaner | ............. H01L 31/02245 |
| | | | 136/255 |
| 2014/0048128 A1 | 2/2014 | Meitl et al. | |
| 2016/0043252 A1 * | 2/2016 | Nagano | .................. G04C 10/02 |
| | | | 438/57 |
| 2017/0213922 A1 | 7/2017 | Lucow et al. | |
| 2017/0309760 A1 * | 10/2017 | Baker-O'Neal | ...... H10F 77/223 |
| 2017/0345955 A1 * | 11/2017 | Chary | .................. H01L 31/188 |
| 2019/0013429 A1 * | 1/2019 | Suarez | ................ H01L 31/1848 |
| 2021/0066534 A1 * | 3/2021 | Koestler | ................. H01L 31/18 |
| 2021/0126140 A1 * | 4/2021 | Zhang | .................. H01L 23/481 |

FOREIGN PATENT DOCUMENTS

| | | | |
|---|---|---|---|
| EP | 1715529 | A2 | 10/2006 |
| EP | 1953828 | A1 | 8/2008 |
| EP | 2510548 | A2 | 10/2012 |
| RU | 2592732 | C1 | 7/2016 |
| UA | 45374 | U | 11/2009 |
| WO | WO89/05521 | A1 | 6/1989 |
| WO | WO2017/205180 | A1 | 11/2017 |
| WO | WO2020/014499 | A1 | 1/2020 |

OTHER PUBLICATIONS

De Lafontaine, Mathieu, et al. "Via sidewall insulation for through cell via contacts." AIP Conference Proceedings, vol. 1881, Issue 1, id.040002. Sep. 2017. (Year: 2017).*

Yoo H et al: "Development of Coplanar Back Contact for Large Area, Thin, GaAs/Ge Solar Cells" Proceedings of the Photovoltaic Specialists Conference, Las Vegas, Oct. 7-11, 1991; (Proceedings of the Phtovoltaic Specialists Conference), New York, IEEE, US, Bd. CONF. 22, pp. 1463-1468, XP010039150, DOI: 10.1109/PVSC. 1991.169447.

De Lafontaine Mathieu et al: "Via sidewall insulation for through cell via contacts", AIP Conference Proceedings 1881, 040002 (2017), DOI: 10. 1063/1.5001424.

Mathieu de Lafontaine et al; "Via sidewall insulation for through cell via contacts"; AIP Conference Proceedings vol. 1881; pp. 1-6; Sep. 6, 2017.

Mathieu de Lafontaine et al; "Influence of plasma process von III-V/Ge mulitjinction solar cell via etching"; Solar Energy Materials and Solar Cells vol. 195 pp. 49-54 Mar. 4, 2019.

* cited by examiner

PASSIVATION METHOD FOR A PASSAGE OPENING OF A WAFER

This nonprovisional application claims priority under 35 U.S.C. § 119(a) to German Patent Application No. 10 2019 006 097.0, which was filed in Germany on Aug. 29, 2019, and which is herein incorporated by reference.

BACKGROUND OF THE INVENTION

Field of the Invention

The present invention relates to a passivation method for a passage opening of a wafer.

Description of the Background Art

To reduce the shading of the front side of a solar cell, it is possible to arrange both the positive and the negative external contact surface on the rear side. In so-called metal wrap through (MWT) solar cells, the solar cell front side, for example, is contacted through a passage contact opening from the rear side.

However, it is essential that the contact metallization within the passage contact opening is reliably insulated from all sub-cells. The prerequisite for a reliably closed insulating layer, however, is a mostly smooth side wall in the area of the passage contact opening that is free of undercuts.

From "Via Sidewall Insulation for Through Cell via Contacts", Mathieu de Lafontaine et al, AIP Conference Proceedings 1881, 040002 (2017), doi: 10.1063/1.5001424, a test method is known for testing the quality of an insulating layer on the side wall of a hole which extends into a solar cell stack. What is studied are $SiO_2$ layers which either have been applied by means of plasma-assisted vapor deposition or by means of plasma-assisted atomic layer deposition on the top and side wall of a plurality of holes. The holes were created by means of a dry etching process. It was found that 40% of the insulating layers generated by means of vapor deposition had defects.

SUMMARY OF THE INVENTION

It is therefore an object of the present invention to provide a device which further develops the prior art.

According to an exemplary embodiment of the invention, a passivation method is provided for a passage opening of a wafer, comprising at least the steps of: providing a wafer comprising a top, a bottom and a plurality of solar cell stacks, wherein each solar cell stack comprises a Ge-substrate that forms the bottom of the wafer, a Ge sub-cell, at least two III-V sub-cells, in the named order, and at least one passage opening that extends from the top to the bottom of the wafer, has a contiguous side wall and has a circumference that is oval in cross section; and applying a dielectric insulating layer by means of chemical vapor deposition to the top of the wafer, the bottom of the wafer and the side wall of the passage opening.

The individual sub-cells of the solar cell stacks can each have a p/n junction and that the layers following the substrate are epitaxially generated on one another and/or connected to one another by means of wafer bonding.

In addition, a Ge sub-cell can contain germanium or consists of germanium, wherein a layer consisting of germanium may optionally also contain other substances in addition to the germanium, in particular dopants, but also impurities.

The same also applies for the III-V sub-cells, which comprise one or more materials of main groups III and V or consist of such materials.

By means of vapor deposition, it is possible to achieve a conformal layer deposition. Thus, not only the top and the bottom, but also the respective areas adjacent to the side surface of the passage opening are coated over the entire surface.

The full surface two-sided vapor deposition leads in particular to a contiguous and sufficiently thick insulating layer within the passage opening.

An advantage of the method is thus that the two-sided full-surface coating using vapor deposition generates a reliable insulating layer within a passage opening without great additional effort.

By means of the vapor deposition, it is also possible in a simple manner to successively apply layers with different materials or a different stoichiometry.

A layer system made up of at least two different insulating layers makes it possible in turn to reduce the pinhole density and/or to increase the adhesion of a subsequent metallization.

The dielectric insulating layer can be applied by means of plasma-assisted vapor deposition. This deposition method can be performed at lower temperatures of only about 100° to 500° C.

The applied dielectric insulating layer on the side wall of the passage opening can have a layer thickness of at least 10 nm.

It has been found that a layer thickness of 10 nm is sufficient to achieve reliable insulation. This is the case in particular when the pinhole density of the insulating layer is as low as possible, for example by using a layer system of at least two layers as the insulating layer and when the passage opening is free of undercuts.

The dielectric insulating layer can includes $SiO_x$ and/or $SiN_x$. The applied insulating layer can comprise in particular a layer system of at least two layers of $SiO_x$ and/or $SiN_x$. The at least two layers are different, for example, with regard to the material or with regard to the stoichiometry.

The dielectric insulating layer can be applied first applied to the top of the wafer, then the wafer is rotated and then the dielectric insulating layer is applied to the bottom. Rotating represents an easy way of achieving double-sided coating of a wafer in an existing vapor deposition device.

The passage opening of the provided wafer can have a first diameter of at most 1 mm and at least 50 μm on an edge bordering the top of the wafer and has a second diameter of at most 1 mm and of at least 50 μm on an edge bordering the bottom of the wafer.

The provided wafer preferably has an overall thickness of at most 300 μm and at least 90 μm.

After the application of the dielectric insulating layer, the dielectric insulating layer can first be structured on the top and then on the bottom or first on the bottom and then on the top, or the bottom and the top are structured at the same time.

The dielectric insulating layer can be wet-chemically etched, wherein in each case a first lacquer layer is applied, cured, exposed and developed and/or an organic material that differs from the first lacquer layer is applied in a structured manner by means of a screen printing process or by means of an inkjet printing process.

A bonding agent, e.g. containing titanium is applied prior to applying the first lacquer layer.

After the application of the first lacquer layer and prior to exposure in the area of the passage opening, a second lacquer layer can be applied. Alternatively, another HFresistant organic filler material, e.g. a wax or resin or glue or thermoplastic, is applied as a further protective layer in the area of the passage opening. According to a further development, the lacquer layer or the other organic filler material is applied by means of a printing process, for example screen printing.

The insulating layer can be formed as a layer system formed of a first layer and at least one second layer.

The first layer is applied prior to the second layer.

The two layers are each applied by means of vapor deposition.

Here, the first layer is first applied to the top of the wafer and to the bottom of the wafer.

The second layer is then applied to the top of the wafer and to the bottom of the wafer.

Alternatively, in a first step, the first layer and the second layer are first successively applied to the top and then, again successively, the first layer and the second layer are applied to the bottom of the wafer.

By combining two or more layers of different materials or at least with a different stoichiometry to an insulating layer, the pinhole density can be significantly reduced. This increases the integrity of the insulating layer and the reliability of the component as a whole.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
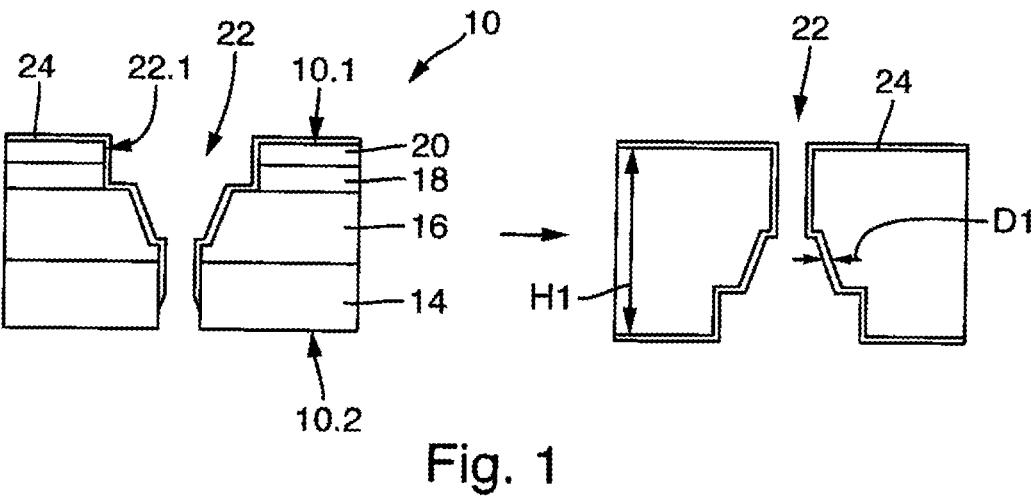
FIG. 1 is a view of an exemplary according to the invention of a passivation method for a passage opening of a wafer.

The illustration in FIG. 1 shows an exemplary embodiment of a passivation method for a passage opening of a wafer.

A stacked wafer 10 has a top 10.1, a bottom 10.2 and a passage opening 22 that extends from the top 10.1 to the bottom 10.2, with a contiguous side wall 22.1 and a circumference that is oval, for example circular, in cross section.

The bottom 10.2 is formed by a Ge substrate 14, followed by a Ge sub-cell 16 and two III-V sub-cells 18 and 20.

At the top 10.1 of the wafer 10, the passage opening 22 has a first diameter B1 and at the bottom 10.2 it has a second diameter B2, wherein said second diameter B2 is smaller than the first diameter B1.

In addition, the passage opening has two step-shaped circumferential shoulders, wherein the shoulders are each formed by a sudden decrease in the diameter of the passage opening, as seen from the top 10.1. The first shoulder has a circumferential shoulder surface that is formed by a top of the Ge sub-cell.

The second shoulder is located in the area of the Ge sub-cell, below a p/n junction of the Ge sub-cell.

The top 10.1 of the wafer 10 and a part of the side surface 22.1 of the passage opening 22 that adjoins the top 10.1 are coated with a dielectric insulating layer 24 by means of chemical vapor deposition.

The wafer 10.1 is then rotated and the bottom 10.2 and a part of the side surface 22.1 of the passage opening 22 that adjoins the bottom 10.2 are coated with the dielectric insulating layer 24 by means of chemical vapor deposition.

A layer thickness D1 of the dielectric insulating layer 24 within the passage opening is at least 10 nm.

Figure 2:
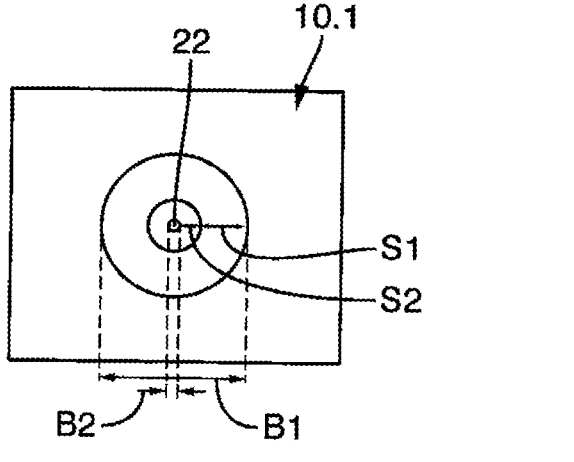
FIG. 2 is a plan view of a passage opening of a wafer which is passivated according to the passivation method.

A further example is shown in the illustration in FIG. 2. Only what is different from the illustration in FIG. 1 will be explained below.

In the plan view of the wafer top 10.1 including the passage opening 22, the two shoulders or shoulder surfaces can be seen. The shoulder surface of the first step-shaped shoulder has a tread depth S1. The second shoulder has a tread surface S2.

Figure 3:
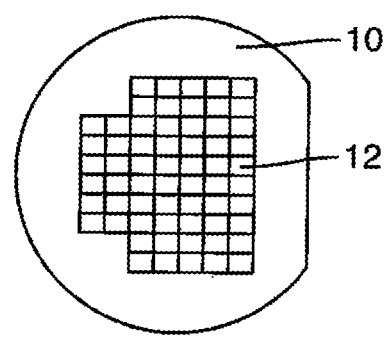
FIG. 3 shows a wafer.

In the illustration in FIG. 3, a further embodiment is shown. Only what is different from the illustration in FIG. 1 or FIG. 2 will be explained below.

The passivation method is carried out on the wafer level, i.e. the wafer comprises a plurality of solar cell stacks 12, which can be seen in the plan view of the wafer top 10.1 in FIG. 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A passivation method comprising:
   providing a wafer having a top, a bottom and at least two solar cell stacks, each of the at least two solar cell stacks has a Ge substrate that forms the bottom of the wafer, a Ge sub-cell, at least two III-V sub-cells and at least one passage opening extending from the top to the bottom of the wafer with a contiguous side wall and a circumference that is oval in cross section, the at least one passage opening having a first open end having a first diameter at the top of the wafer and a second open end having a second diameter at the bottom of the wafer, the second diameter being smaller than the first diameter; and
   after said providing the wafer with the at least one passage opening, applying a dielectric insulating layer via chemical vapor deposition to the top of the wafer, the bottom of the wafer and the side wall of the at least one passage opening,
   wherein the dielectric insulating layer is applied via a plasma-assisted vapor deposition,
   wherein the dielectric insulating layer contains SiOx or SiNx, and
   wherein the at least one passage opening has two stepped circumferential shoulders formed by a sudden decrease in a diameter of the at least one passage opening viewed from a top.

2. The method according to claim 1, wherein the applied dielectric insulating layer on the side wall of the passage opening has a layer thickness of at least 10 nm.

3. The method according to claim 1, wherein the dielectric insulating layer is first applied to the top of the wafer, then the wafer is rotated and then the dielectric insulating layer is applied to the bottom.

4. The method according to claim 1, wherein the first diameter is at most 1 mm and at least 50 μm on an edge bordering the top of the wafer, and wherein the wafer has an overall thickness of at most 300 μm and of at least 90 μm.

5. The method according to claim 1, wherein the dielectric insulating layer is formed as a layer system comprising a first layer and at least one second layer, and wherein the first layer is applied prior to the second layer.

6. The method according to claim 1, wherein the first diameter is at most 1 mm and at least 50 μm on an edge bordering the top of the wafer.

7. The method according to claim 1, wherein the second diameter is at most 1 mm and at least 50 μm on an edge bordering the bottom of the wafer.

8. The method according to claim 1, wherein the wafer that is provided has an overall thickness of at most 300 μm and of at least 90 μm.

9. The method according to claim 1, wherein the dielectric insulating layer is wet-chemically etched.

10. The method according to claim 1, wherein the at least one passage opening is a through-hole.

11. A passivation method comprising:

providing a wafer having a top, a bottom and at least two solar cell stacks, each of the at least two solar cell stacks has a Ge substrate that forms the bottom of the wafer, a Ge sub-cell, at least two III-V sub-cells and at least one passage opening extending from the top to the bottom of the wafer with a contiguous side wall and a circumference that is oval in cross section, the at least one passage opening having two stepped circumferential shoulders formed by a sudden decrease in a diameter of the at least one passage opening viewed from a top, the at least one passage opening having a first open end having a first diameter at the top of the wafer and a second open end having a second diameter at the bottom of the wafer, the second diameter being smaller than the first diameter; and after said providing the wafer with the at least one passage opening, applying a dielectric insulating layer via chemical vapor deposition to the top of the wafer, the bottom of the wafer and the side wall of the passage opening.

* * * * *